US009728874B2

(12) United States Patent
Cai

(10) Patent No.: US 9,728,874 B2
(45) Date of Patent: Aug. 8, 2017

(54) ELECTRICAL CONNECTOR

(71) Applicant: LOTES CO., LTD, Keelung (TW)

(72) Inventor: You Hua Cai, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/375,379

(22) Filed: Dec. 12, 2016

(65) Prior Publication Data

US 2017/0194729 A1 Jul. 6, 2017

(30) Foreign Application Priority Data

Dec. 31, 2015 (CN) ..................... 2015 2 1121747 U

(51) Int. Cl.

| | |
|---|---|
| ***H01R 12/00*** | (2006.01) |
| ***H05K 1/00*** | (2006.01) |
| ***H01R 12/72*** | (2011.01) |
| ***H01R 12/73*** | (2011.01) |
| ***H01R 12/70*** | (2011.01) |
| ***H01R 13/26*** | (2006.01) |
| ***H01R 13/428*** | (2006.01) |
| ***H01R 13/629*** | (2006.01) |
| ***H01R 13/633*** | (2006.01) |

(52) U.S. Cl.

CPC ......... *H01R 12/721* (2013.01); *H01R 12/707* (2013.01); *H01R 12/737* (2013.01); *H01R 13/26* (2013.01); *H01R 13/428* (2013.01); *H01R 13/62966* (2013.01); *H01R 13/6335* (2013.01)

(58) Field of Classification Search

CPC .. H01R 12/721; H01R 12/737; H01R 12/707; H01R 13/6335; H01R 13/428; H01R 13/62966; H01R 13/26

USPC ........................................................... 439/62

See application file for complete search history.

(56) References Cited

U.S. PATENT DOCUMENTS 3,530,422 A * 9/1970 Goodman ............ H01R 12/585 29/845

* cited by examiner

*Primary Examiner* — Javaid Nasri

(74) *Attorney, Agent, or Firm* — Locke Lord LLP; Tim Tingkang Xia, Esq.

(57) ABSTRACT

An electrical connector includes an insulating body having at least one terminal slot, and at least one terminal received in the terminal slot. The terminal slot is provided with a first inner wall and a second inner wall. The terminal has a fixing portion. The fixing portion is sequentially provided with a bonding section and a thinned section. A thickness of the thinned section is smaller than that of the bonding section. The bonding section forms interference fit with the second inner wall. The thinned section forms interference fit with the first inner wall, and extends to the second inner wall. In a direction perpendicular to the second inner wall, a gap exists between the thinned section and the second inner wall.

13 Claims, 8 Drawing Sheets

ELECTRICAL CONNECTOR

CROSS-REFERENCE TO RELATED APPLICATION

This non-provisional application claims priority to and benefit of, under 35 U.S.C. §119(a), Patent Application No. 201521121747.9 filed in P.R. China on Dec. 31, 2015, the entire content of which is hereby incorporated by reference.

FIELD OF THE INVENTION

The present invention relates to an electrical connector, and more particularly to a card edge connector configured to insert an electronic card.

BACKGROUND OF THE INVENTION

A known electrical connector includes an insulating body and multiple terminals arranged on the insulating body. The insulating body is provided with multiple terminal slots which are arranged in a row, and a fence is arranged between every two adjacent terminal slots. The multiple terminals are correspondingly received in the multiple terminal slots. Each terminal has a fixing portion, and a contact portion and a soldering portion formed by extending from two ends of the fixing portion. One or more protruding portions are outward protruded from two side edges of the fixing portion respectively. When the terminals are inserted into the terminal slots, protruding portions of adjacent terminals form interference fit with slot walls of the terminal slots (i.e. sidewalls of the fences), and the terminals are retained on the insulating body by the terminals through the protruding portions.

Under a miniaturization development trend of electrical connectors, the number of the terminals of the electrical connector continuously increases, and the terminals are also arranged more and more densely. The one or more protruding portions are outward protruded from the two side edges of the fixing portion respectively, so that thicknesses of interference fit portions of the terminals and the terminal slots are increased, wall thicknesses of the fences are gradually reduced, and strength of the fences is weakened. Moreover, the protruding portions of the adjacent terminals have relative acting force on the fences, so that the fences are likely to be damaged in a process of inserting the terminals into the insulating body.

Therefore, a heretofore unaddressed need exists in the art to address the aforementioned deficiencies and inadequacies.

SUMMARY OF THE INVENTION

In one aspect, the present invention is intended to provide an electrical connector capable of reducing a thickness of a fixing portion in interference fit with an insulating body, strengthening retaining force between terminals and the insulating body, and reducing external force required by insertion of the terminals into terminal slots.

In certain embodiments, an electrical connector includes an insulating body and at least one terminal disposed in the insulating body. The insulating body is provided with at least one terminal slot. The terminal slot has a first inner wall and a second inner wall. The terminal has a fixing portion. The fixing portion is sequentially provided with a bonding section and a thinned section. A thickness of the thinned section is smaller than that of the bonding section. The bonding section forms interference fit with the second inner wall. The thinned section forms interference fit with the first inner wall, and extends to the second inner wall. In a direction perpendicular to the second inner wall, a gap exists between the thinned section and the second inner wall.

In certain embodiments, the fixing portion is provided with two relatively parallel plate surfaces, and the thinned section is formed by thinning from one plate surface toward the other plate surface.

In certain embodiments, the bonding section and the thinned section are arranged on two sides of the fixing portion respectively. A retaining slot is formed in each of two sides of the terminal slot in a recessed manner, and each retaining slot is provided with the first inner wall and the second inner wall.

In certain embodiments, outer side edges of the thinned section and the bonding section on the same side of the fixing portion are arranged to be flush.

In certain embodiments, the insulating body is provided with multiple terminal slots which are arranged in a row, there are multiple terminals correspondingly arranged in the multiple terminal slots, and the thinned sections of every two adjacent terminals are staggered.

In certain embodiments, a contact portion is formed by upward extension from an upper end of the fixing portion, a soldering portion is formed by downward extension from a lower end of the fixing portion, the thinned section is positioned above the bonding section, and the bonding section is closer to the soldering portion than the thinned section.

In certain embodiments, a contact portion is formed by upward extension from an upper end of the fixing portion, a soldering portion is formed by downward extension from a lower end of the fixing portion, the thinned section is positioned below the bonding section, and the thinned section is closer to the soldering portion than the bonding section.

In certain embodiments, the first inner wall and the second inner wall are both planes, and are connected into a stair-step shape through a chamfer.

In certain embodiments, each of a length of the bonding section and a length of interference fit between the thinned section and the first inner wall is ½ of a length of the thinned section.

In certain embodiments, the fixing portion is provided with two relatively parallel plate surfaces, and the thinned section is formed by face-to-face thinning from the two plate surfaces.

In certain embodiments, the bonding section and the thinned section are arranged on two sides of the fixing portion respectively, a retaining slot is formed in each of the two sides of the terminal slot in a recessed manner, and each retaining slot is provided with the first inner wall and the second inner wall corresponding to each plate surface.

In certain embodiments, there are multiple terminals, the insulating body is provided with a slot configured to insert an electronic card, multiple terminal slots are arranged on two sides of the slot to correspondingly accommodate the multiple terminals, the insulating body is provided with an assembling portion on at least one end of the slot, and the assembling portion is pivoted to an ejector.

In certain embodiments, a distance between every two adjacent terminals is 0.75 millimeter (mm).

Compared with the related art, in certain embodiments of the present invention, the fixing portion is sequentially provided with the bonding section and the thinned section, and the thickness of the thinned section is smaller than that of the bonding section, that is, the thinned section is formed by performing thinning processing on the basis of an original thickness of the fixing portion, so that no additional retaining structure is required to be added to the fixing portion to increase the thickness thereof. In addition, the bonding section forms interference fit with the second inner wall, and the thinned section forms interference fit with the first inner wall, so that the fixing portion and the terminal slot form interference fit at two positions, and retaining force between the terminal and the insulating body can be strengthened. Moreover, the thinned section extends to the second inner wall, and in the direction perpendicular to the second inner wall, the gap exists between the thinned section and the second inner wall, so that interference fit between the fixing portion of the whole length and the terminal slot can be avoided, and external force required by insertion of the terminal into the terminal slot can be reduced.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
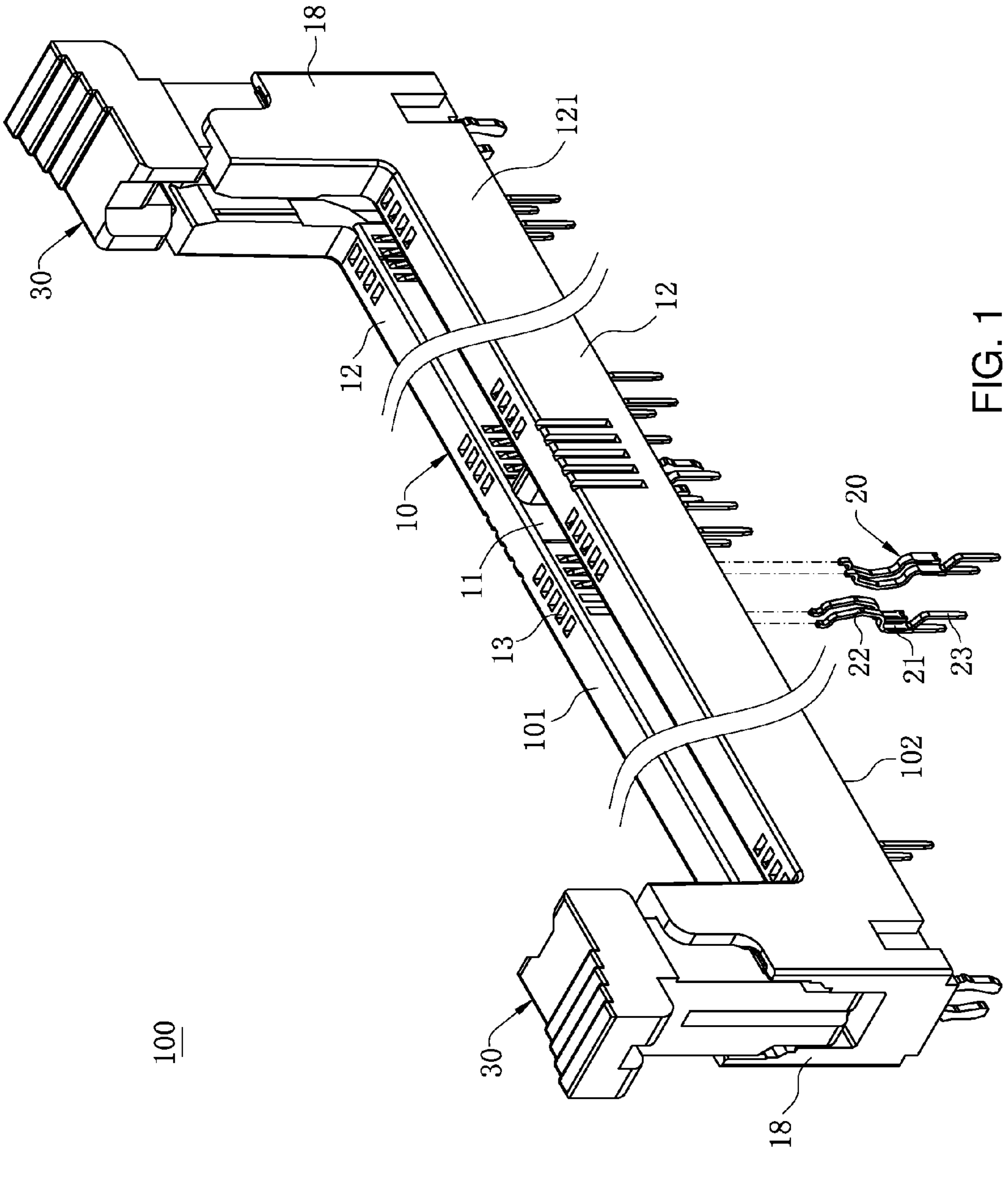
FIG. 1 is a schematic three-dimensional exploded view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Referring to FIG. 1, a preferred embodiment of an electrical connector 100 according to the present invention is shown, and the electrical connector 100 is configured to connect an electronic card (not shown) and a circuit board (not shown). The electrical connector 100 includes an insulating body 10, multiple terminals 20 arranged on the insulating body 10, and two ejectors 30 pivoted to the insulating body 10.

Figure 2:
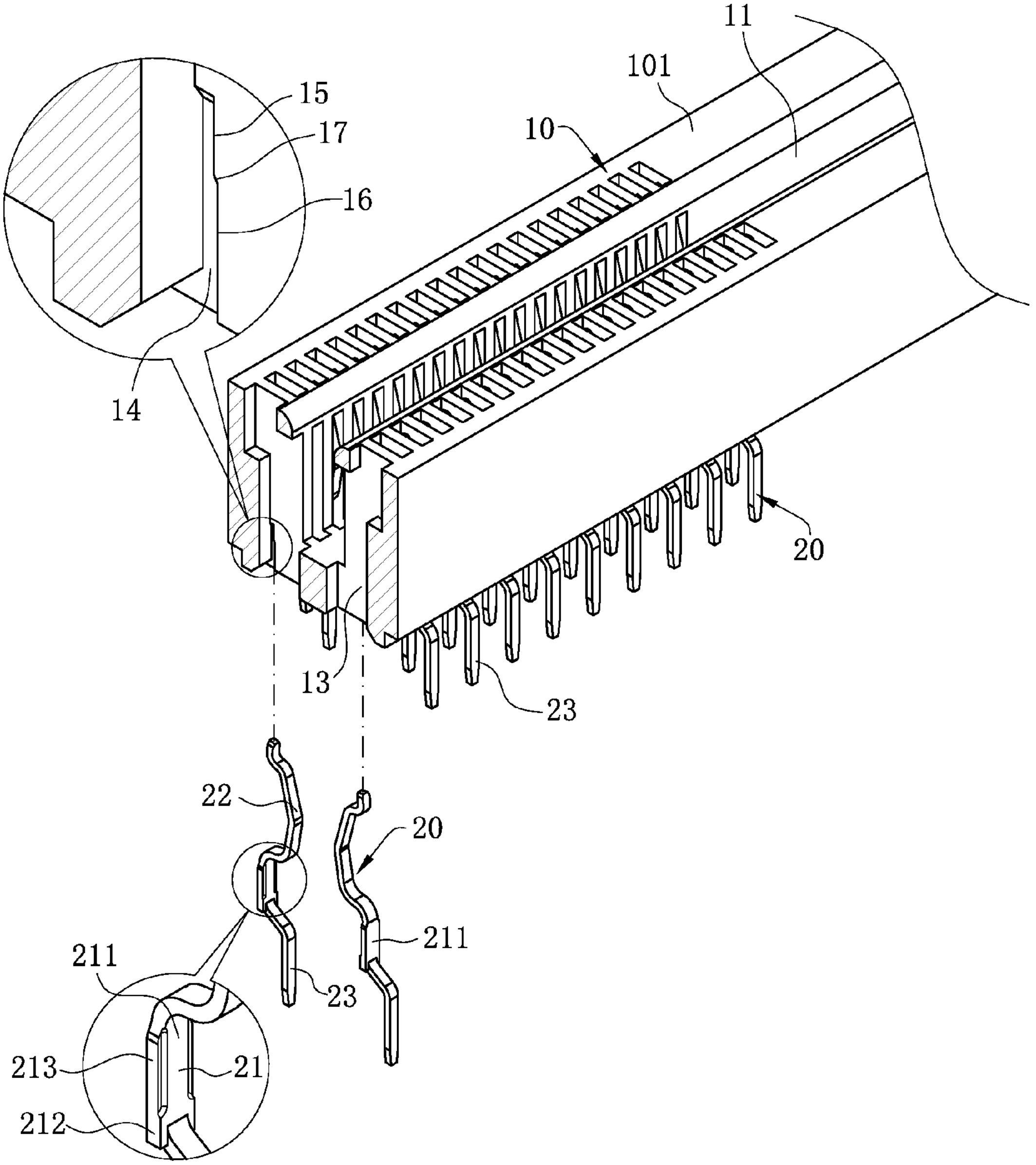
FIG. 2 is a three-dimensional part sectioned view of FIG. 1.

Referring to FIG. 1 and FIG. 2, the insulating body 10 is provided with a mating surface 101 and a mounting surface 102 opposite to the mating surface 101, where the mating surface 101 is a top surface of the insulating body 10, and the mounting surface 102 is a bottom surface of the insulating body 10. The insulating body 10 is provided with a slot 11 formed by downward recession from the mating surface 101, and the slot 11 is configured for the electronic card to be inserted therein. The insulating body 10 has two sidewalls 12 positioned on two sides of the slot 11. Each sidewall 12 has an outer wall surface 121. Multiple terminal slots 13 are arranged in a row on each sidewall 12. The terminal slots 13 are communicated with the slot 11.

Figure 3:
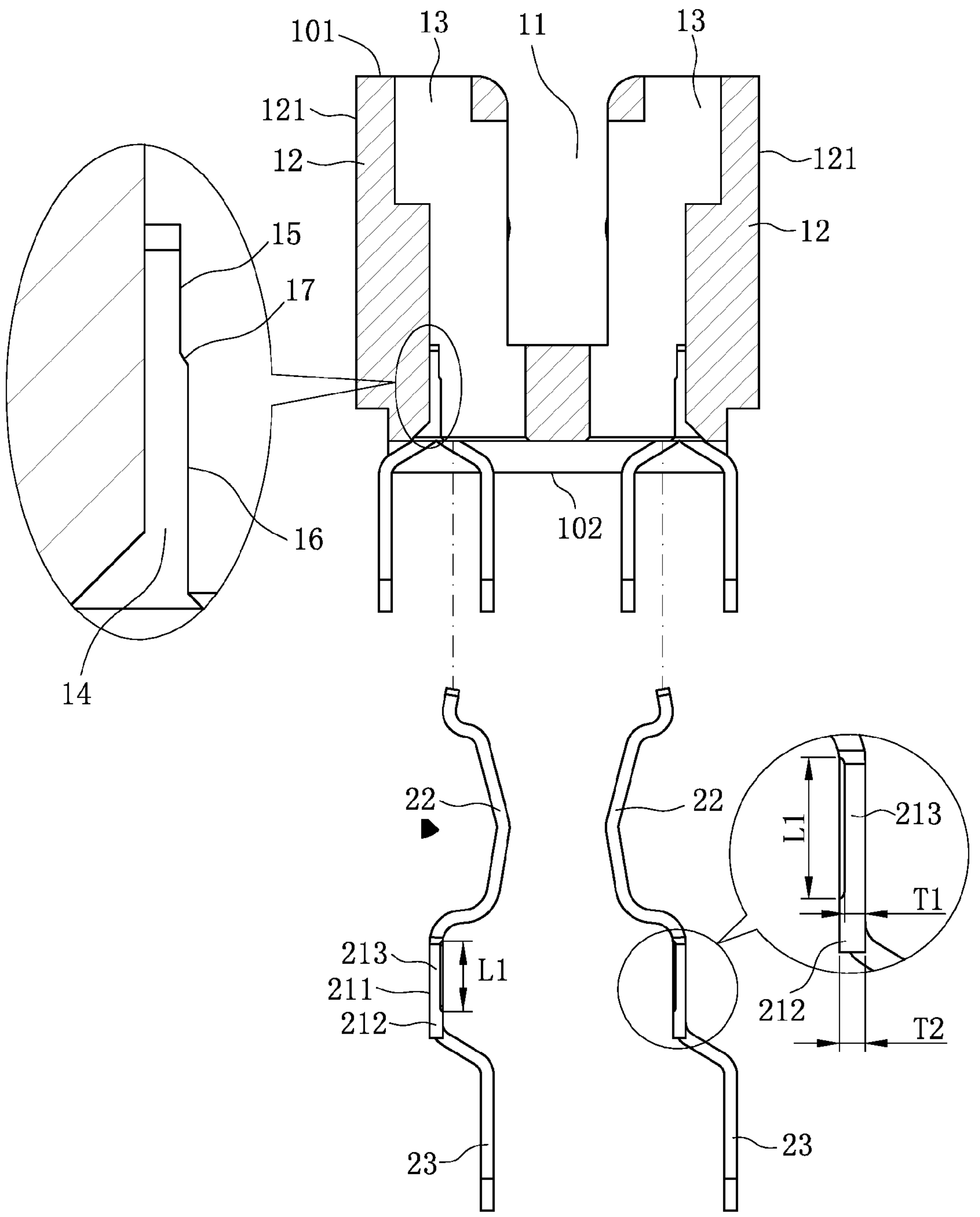
FIG. 3 is a front view of FIG. 2.

Referring to FIG. 2 and FIG. 3, a retaining slot 14 is formed in each of two sides of each terminal slot 13 The retaining slots 14 are adjacent to the mounting surface 102.

Each retaining slot 14 is provided with a first inner wall 15 and a second inner wall 16. The first inner walls 15 and the second inner walls 16 are mutually parallel planes, and are arranged in parallel with the outer wall surfaces 121 respectively. The first inner walls 15 are arranged farther away from the slot 11 than the second inner walls 16. Meanwhile, the first inner walls 15 are arranged farther away from the mounting surface 102 than the second inner walls 16. Each first inner wall 15 is connected with the corresponding second inner wall 16 through a chamfer 17. The first inner walls 15, the chamfers 17 and the second inner walls 16 are sequentially connected end to end to form a stair-step shape.

Referring to FIG. 1, the insulating body 10 is also provided with assembling portions 18 at each of two ends of the slot 11. Each assembling portion 18 is pivoted to the corresponding ejector 30, and the ejectors 30 can rotate relative to the insulating body 10 to lock and release the electronic card (not shown). In other embodiments, the electrical connector 100 may also be provided with only one ejector 30 pivoted to the insulating body 10.

Referring to FIG. 2 and FIG. 3, the multiple terminals 20 are continuous terminals formed by stamping and bending a metal strip (not shown). The terminals 20 are inserted into the terminal slots 13 in a direction from the mounting surface 102 to the mating surface 101. That is, the terminals 20 are assembled and fixed in the terminal slots 13 from bottom to top, and a distance between every two adjacent terminals 20 is about 0.75 mm. Each terminal 20 includes a fixing portion 21, a contact portion 22 bending and extending upward from an upper end of the fixing portion 21, and a soldering portion 23 bending and extending downward from a lower end of the fixing portion 21. Each contact portion 22 partially protrudes and extends into the slot 11 to contact with the electronic card (not shown), and each soldering portion 23 is exposed from the mounting surface 102 to be soldered with the circuit board (not shown).

Figure 5:
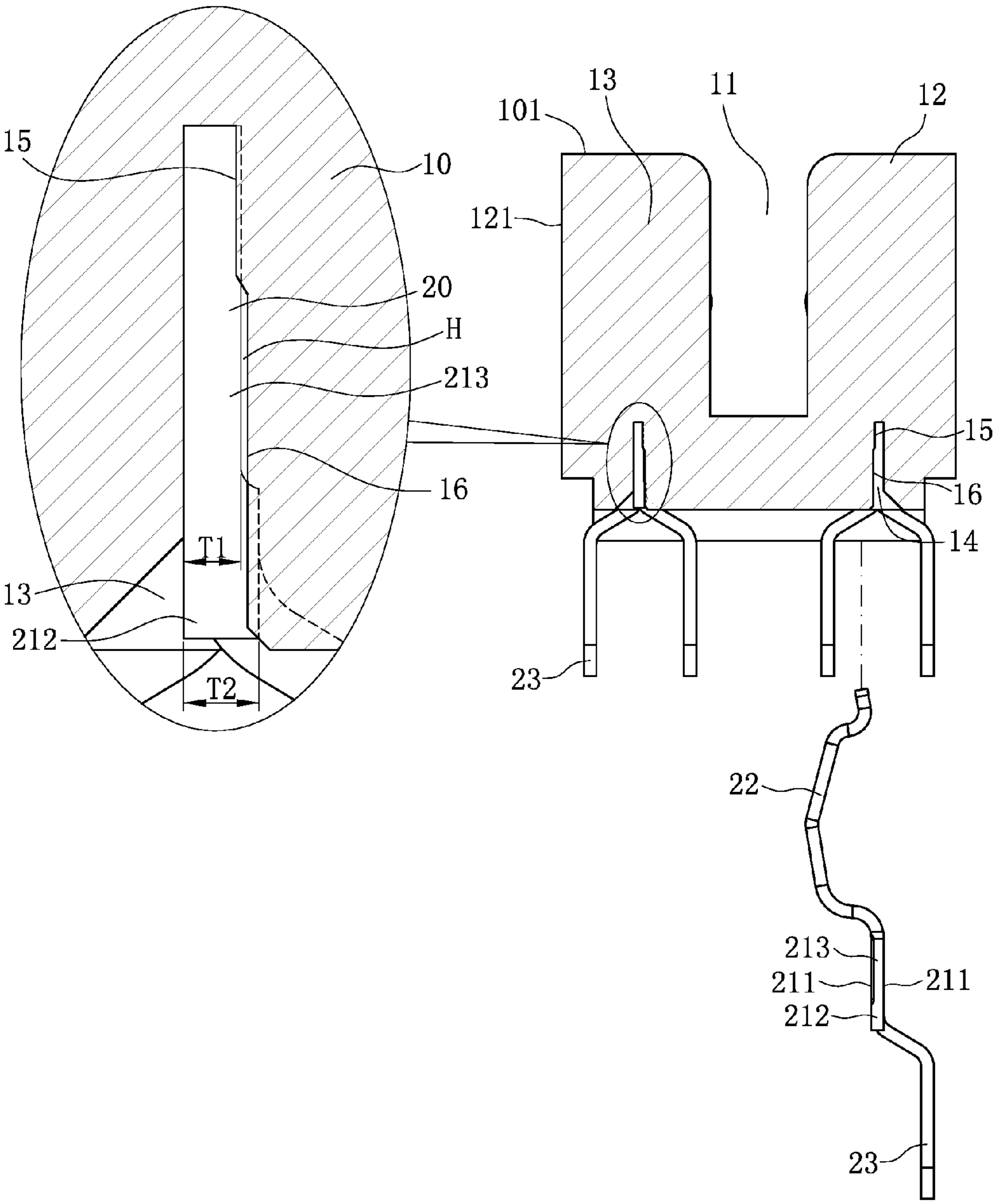
FIG. 5 is a sectional view of a part intercepted along line A-A shown in FIG. 4.

Referring to FIGS. 2, 3 and 5, each fixing portion 21 has two relatively parallel plate surfaces 211, and the two plate surfaces 211 define a first thickness T1. A bonding section 212 and a thinned section 214 are sequentially arranged on each of two sides of each fixing portion 21. Outer side edges of the thinned section 213 and the bonding section 212 on the same side of each fixing portion 21 are arranged to be flush. The outer side edges are the lateral surface of the fixing portion 21, that is, the cutting surface formed by cutting the corresponding terminal 20 from the metal strip (not shown). Each thinned section 213 is positioned above the corresponding bonding section 212, and each bonding section 212 is closer to the corresponding soldering portion 23 than the corresponding thinned section 213. A thickness of each bonding section 212 is the first thickness T1, that is, the thickness of each bonding section 212 is a range defined by the two corresponding plate surfaces 211, and each bonding section 212 forms interference fit with the corresponding second inner wall 16.

Referring to FIGS. 2, 3 and 5, each thinned section 213 has a second thickness T2, and each thinned section 213 is thinner than the corresponding bonding section 212. That is, the second thickness T2 is smaller than the first thickness T1. Each thinned section 213 is formed by thinning from one plate surface 211 to the other plate surface 211. Each thinned section 213 forms interference fit with the corresponding first inner wall 15, and extends to the corresponding second inner wall 16. In a direction perpendicular to the second inner wall 16, a gap H exists between each thinned section 213 and the corresponding second inner wall 16. Each thinned section 213 has a first length L1, and each of a length of each bonding section 212 and a length of interference fit between each thinned section 213 and the corresponding first inner wall 15 is about ½ of the first length L1.

Figure 4:
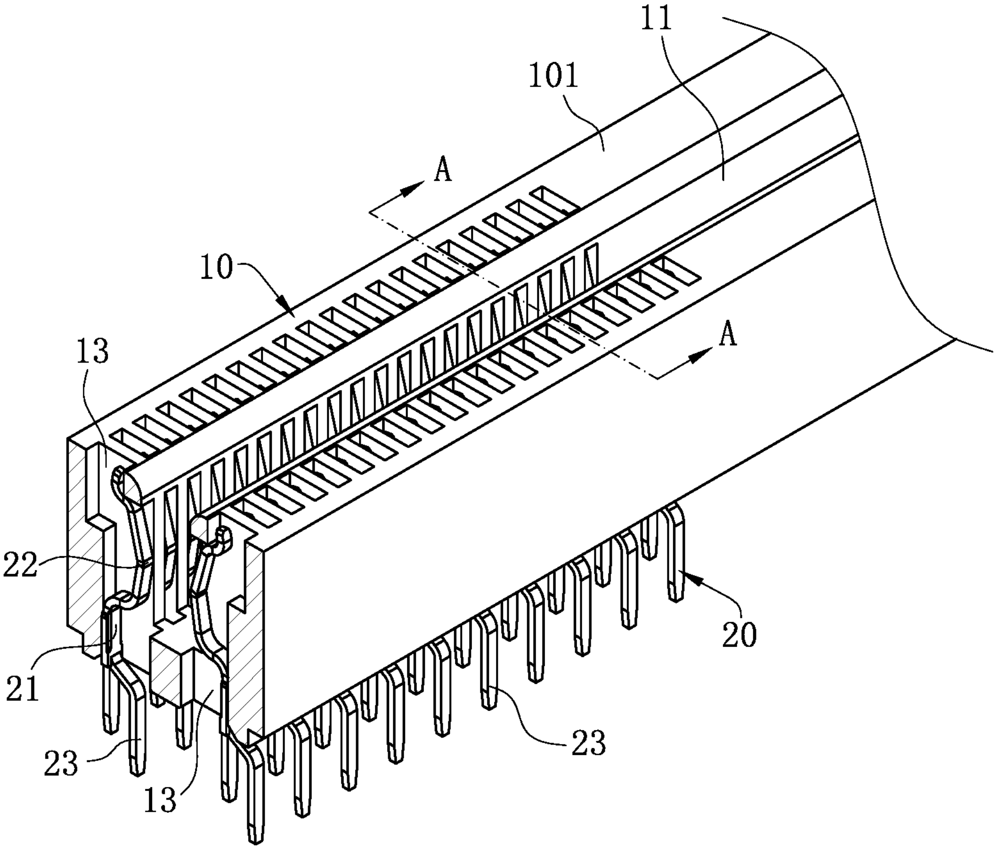
FIG. 4 is a three-dimensional assembled view of FIG. 2.

Referring to FIGS. 3-5, in a process of assembling the terminals 20 in the terminal slots 13 from bottom to top, the contact portions 22 enter the terminal slots 13 at first. Then the thinned sections 213 enter. Since the gaps H exist between the thinned sections 213 and the second inner walls 16 in the direction perpendicular to the second inner walls 16, the thinned sections 213 can easily pass through the second inner walls 16 without interference with the second inner walls 16 in an upward insertion process. When the thinned sections 213 are continued to be upward inserted and start forming interference with the first inner walls 15, the bonding sections 212 also start forming interference with the second inner walls 16. Since the lengths of interference fit between the thinned sections 213 and the first inner walls 15 are ½ of the first length L1 and the length of each bonding section 212 is ½ of the first length L1, interference fit between the fixing portions 21 of the whole length and the retaining slots 14 can be avoided, and external force required by insertion of the terminals 20 into the terminal slots 13 can be reduced.

Figure 6:
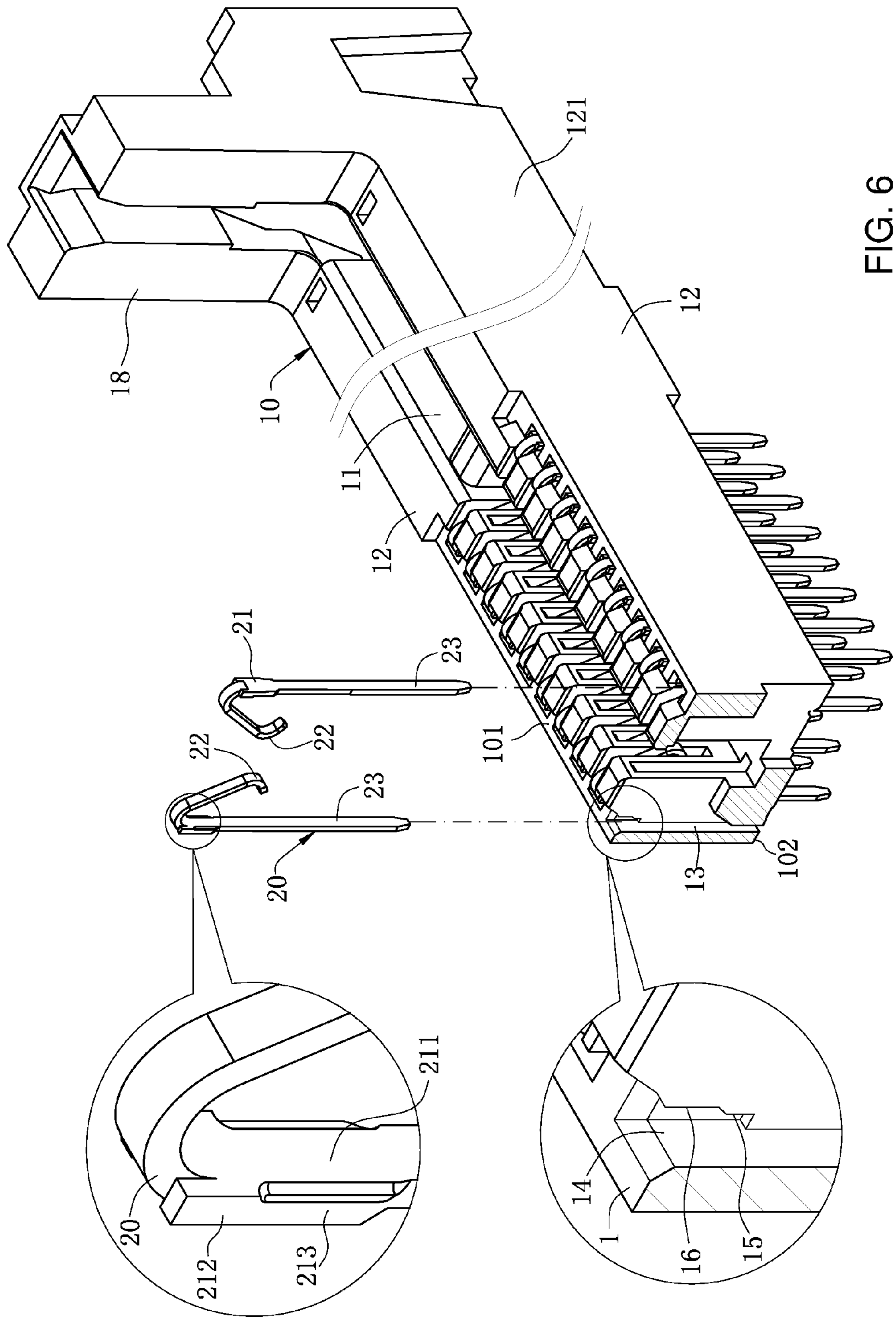
FIG. 6 is a schematic partial three-dimensional exploded view of an electrical connector according to a second embodiment of the present invention.

Referring to FIG. 6, a second embodiment of the present invention is shown, and the difference between the preferred embodiment and the second embodiment lies in that: the retaining slots 14 are adjacent to the mating surface 101, where the first inner walls 15 are farther away from the slot 11 than the second inner walls 16, and meanwhile, the first inner walls 15 are farther than the second inner walls 16 away from the mating surface 101. The terminals 20 are inserted into the terminal slots 13 in a direction from the mating surface 101 to the mounting surface 102, the thinned sections 213 are positioned below the bonding sections 212, and the thinned sections 213 are closer to the soldering portions 23 than the bonding sections 212.

Figure 7:
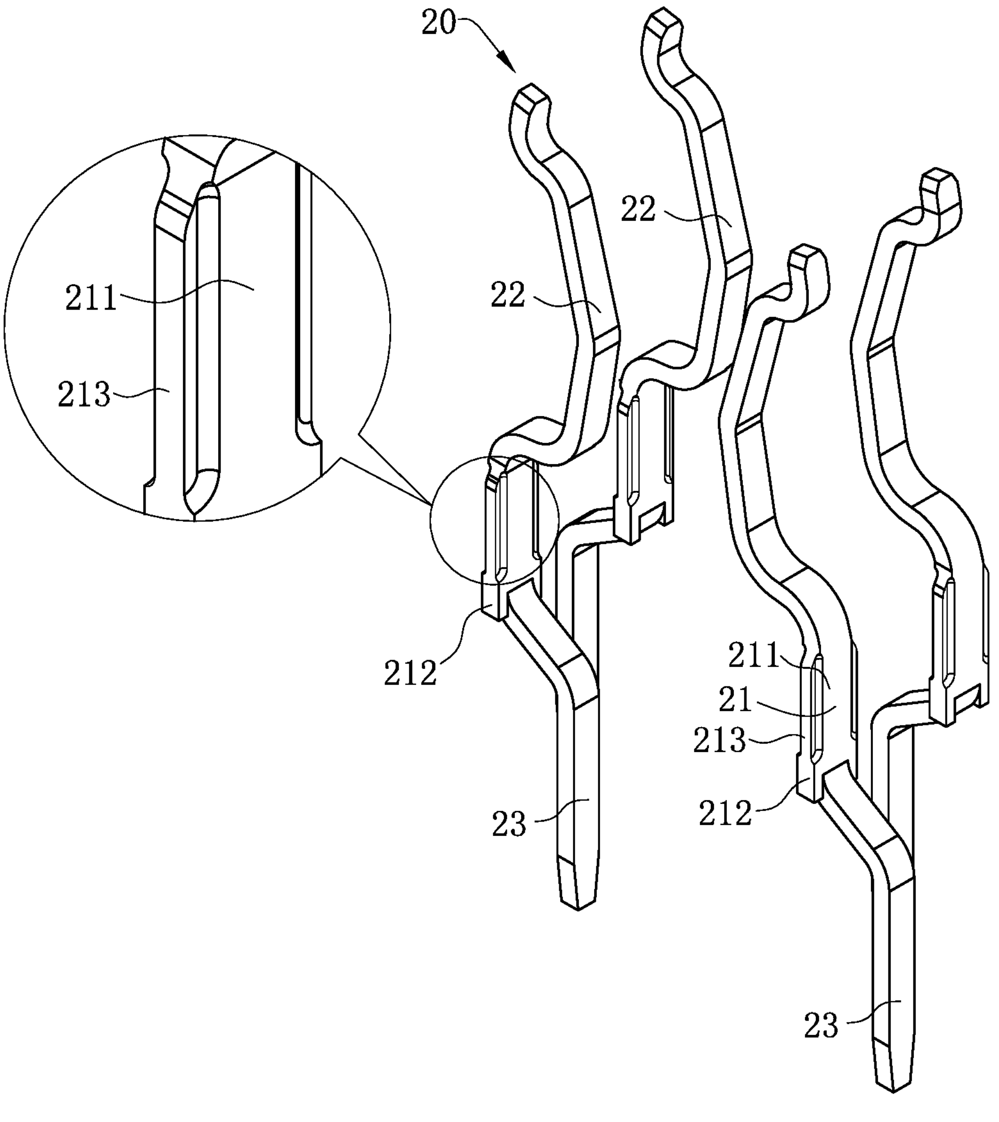
FIG. 7 is a schematic three-dimensional view of a terminal in an electrical connector according to a third embodiment of the present invention.

Referring to FIG. 5 and FIG. 7, FIG. 7 shows a structure of a terminal 20 according to a third embodiment of the present invention. The thinned sections 213 are formed by face-to-face thinning from the two plate surfaces 211. Each retaining slot 14 is provided with the first inner wall 15 and the second inner wall 16 corresponding to each plate surface 211. That is, the thinned sections 213 are clamped between the two first inner walls 15. The thinned sections 213 form interference fit with the first inner walls 15. Meanwhile, the bonding sections 212 are also clamped between the two second inner walls 16, and the bonding sections 212 form interference fit with the second inner walls 16.

Figure 8:
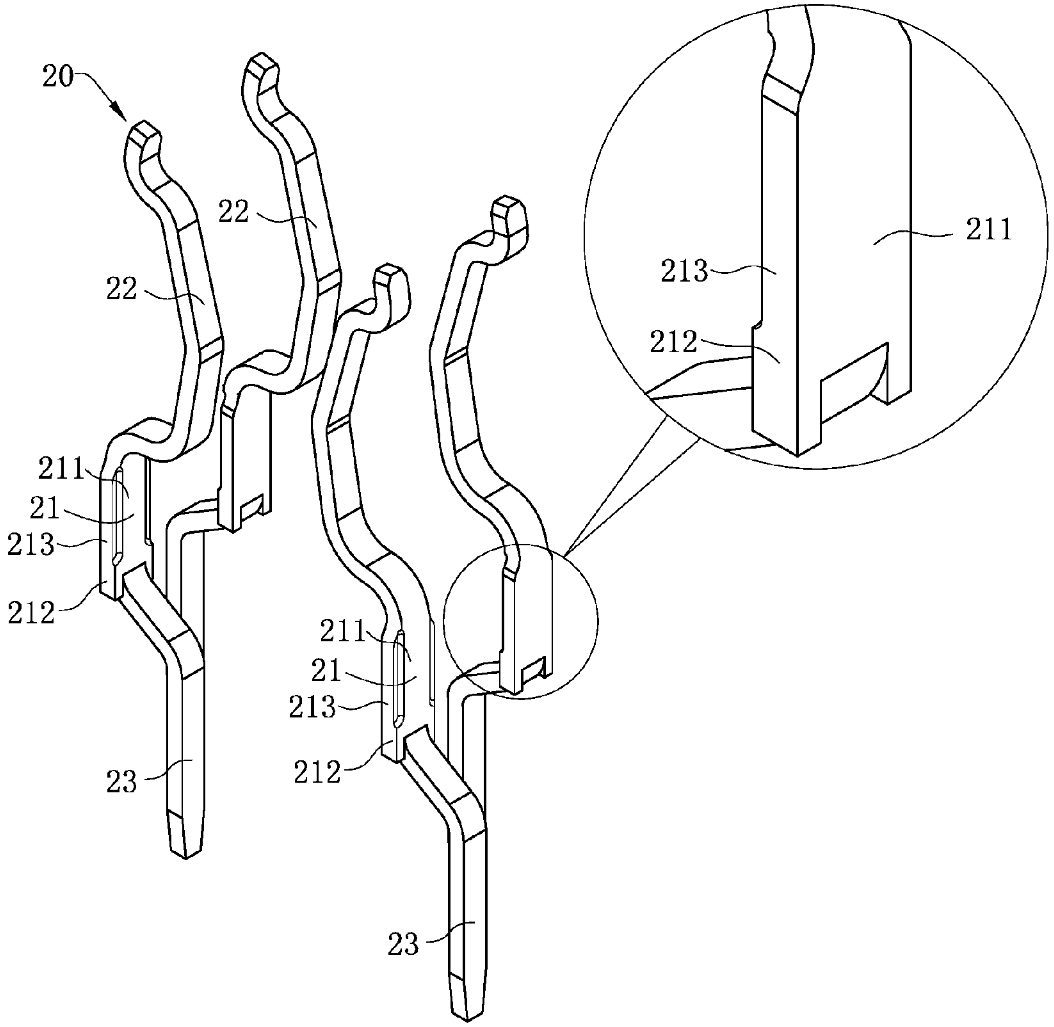
FIG. 8 is a schematic three-dimensional view of a terminal in an electrical connector according to a fourth embodiment of the present invention.

Referring to FIG. 8, a structure of a terminal 20 according to a fourth embodiment of the present invention is shown. The thinned sections 213 of every two adjacent terminals 20 in the multiple terminals 20 which are arranged in a row are arranged in a staggered way. That is, as shown in FIG. 8, the thinned sections 213 of one of the two adjacent terminals 20 is formed by thinning from one plate surface 211 near the slot 11, and the thinned sections 213 of the other of the two adjacent terminals 20 is formed by thinning from the other plate surface 211 away from the slot 11.

Of course, in other embodiments, the insulating body 10 may also be provided with only one terminal slot 13, the structure of the foregoing terminal slot 13 is adopted, and the electrical connector 100 correspondingly includes one terminal 20 matched with the terminal slot 13.

In summary, the electrical connector according to certain embodiments of the present invention has the following beneficial advantages:

1. The fixing portion 21 has the two relatively parallel plate surfaces 211, the thickness of the bonding section 212 is the thickness defined by the two plate surfaces 211, and the thinned section 213 is formed by thinning from one plate surface 211 to the other plate surface 211, so that no additional retaining structure is required to be added to the fixing portion 21 to increase the thickness thereof. The fixing portion 21 is sequentially provided with the bonding section 212 and the thinned section 213, the first inner wall 15 and the second inner wall 16 form the stair-step shape, the bonding section 212 forms interference fit with the second inner wall 16, and the thinned section 213 forms interference fit with the first inner wall 15, so that the fixing portion 21 and the terminal slot 13 form interference fit at two positions, and retaining force between the terminal 20 and the insulating body 10 can be strengthened. The thinned section 213 extends to the second inner wall 16, and in the direction perpendicular to the second inner wall 16, the gap H exists between the thinned section 213 and the second inner wall 16, so that interference fit between the fixing portion 21 of the whole length and the retaining slots 14 can be avoided, and external force required by insertion of the terminal 20 into the terminal slot 13 can be reduced.

2. The first inner wall 15 is connected with the second inner wall 16 through the chamfer 17, the first inner wall 15, the chamfer 17 and the second inner wall 16 are sequentially connected end to end to form the stair-step shape. The chamfer 17 is arranged to facilitate insertion of the thinned section 213 into an upper-end space of the retaining slot 14, thereby forming interference fit between the thinned section 213 and the first inner wall 15.

3. The outer side edges of the thinned sections 213 and the bonding sections 212 on the same sides of the fixing portions 21 are arranged to be flush, and in the direction perpendicular to the second inner walls 16, the thinned sections 213 and the bonding sections 212 correspondingly form interference fit with the first inner walls 15 and the second inner walls 16 respectively, so that it is unnecessary to additionally arrange stabs (not shown) on the fixing portions 21 in the width direction thereof (i.e., an arrangement direction of the multiple terminals 20 on the same side of the slot 11) for interference fit with the retaining slots 14. By such a structure, the distance between every two adjacent fixing portions 21 can be increased, the fixing portions 21 can be prevented from applying excessive acting force on fences (not labeled) between every two adjacent terminal slots 13 in the width direction of the fixing portions, and the fences (not labeled) are unlikely to be damaged in the process of inserting the terminals 20 into the terminal slots 13.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:

an insulating body having at least one terminal slot, the terminal slot having a first inner wall and a second inner wall; and at least one terminal received in the terminal slot, wherein the terminal has a fixing portion, the fixing portion is sequentially provided with a bonding section and a thinned section, a thickness of the thinned section is smaller than that of the bonding section, the bonding section forms interference fit with the second inner wall, the thinned section forms interference fit with the first inner wall, and extends to the second inner wall, and in a direction perpendicular to the second inner wall, a gap exists between the thinned section and the second inner wall.

2. The electrical connector of claim 1, wherein the fixing portion has two relatively parallel plate surfaces, and the thinned section is formed by thinning from one plate surface to the other plate surface.

3. The electrical connector of claim 2, wherein the bonding section and the thinned section are arranged on each of two sides of the fixing portion respectively, a retaining slot is formed in each of two sides of the terminal slot in a recessed manner, and each retaining slot is provided with the first inner wall and the second inner wall.

4. The electrical connector of claim 3, wherein outer side edges of the thinned section and the bonding section on the same side of the fixing portion are arranged to be flush.

5. The electrical connector of claim 2, wherein the insulating body is provided with a plurality of terminal slots arranged in a row, the at least one terminal comprises a plurality of terminals, and the plurality of terminals are correspondingly received in the terminal slots, and the thinned sections of every two adjacent terminals are arranged in a staggered way.

6. The electrical connector of claim 1, wherein a contact portion is formed by extending upward from an upper end of the fixing portion, a soldering portion is formed by extending downward from a lower end of the fixing portion, the thinned section is positioned above the bonding section, and the bonding section is closer to the soldering portion than the thinned section.

7. The electrical connector of claim 1, wherein a contact portion is formed by extending upward from an upper end of the fixing portion, a soldering portion is formed by extending downward from a lower end of the fixing portion, the thinned section is positioned below the bonding section, and the thinned section is closer to the soldering portion than the bonding section.

8. The electrical connector of claim 1, wherein the first inner wall and the second inner wall are both planes, and are connected into a stair-step shape through a chamfer.

9. The electrical connector of claim 1, wherein each of a length of the bonding section and a length of interference fit between the thinned section and the first inner wall is ½ of a length of the thinned section.

10. The electrical connector of claim 1, wherein the fixing portion has two relatively parallel plate surfaces, and the thinned section is formed by face-to-face thinning from the two plate surfaces.

11. The electrical connector of claim 10, wherein the bonding section and the thinned section are arranged on each of two sides of the fixing portion, a retaining slot is formed in each of two sides of the terminal slot in a recessed manner, and each retaining slot is provided with the first inner wall and second inner wall corresponding to each plate surface.

12. The electrical connector of claim 1, wherein the at least one terminal includes a plurality of terminals and the at least one terminal slot includes a plurality of terminal slots, the insulating body is provided with a slot configured to insert an electronic card, the terminal slots are formed on two sides of the slot to correspondingly receive the terminals, the insulating body is provided with an assembling portion on at least one end of the slot, and the assembling portion is pivoted to an ejector.

13. The electrical connector of claim 12, wherein a distance between every two adjacent terminals is 0.75 mm.

* * * * *